US009012247B2

(12) United States Patent
Baldi et al.

(10) Patent No.: US 9,012,247 B2
(45) Date of Patent: Apr. 21, 2015

(54) METHOD OF MANUFACTURING AN INK-JET PRINTHEAD

(75) Inventors: Silvia Baldi, Arnad (IT); Danilo Bich, Arnad (IT); Lucia Giovanola, Arnad (IT); Anna Merialdo, Arnad (IT); Paolo Schina, Arnad (IT)

(73) Assignee: SICPA Holding SA, Prilly (CH)

( * ) Notice: Subject to any disclaimer, the term of this patent is extended or adjusted under 35 U.S.C. 154(b) by 70 days.

(21) Appl. No.: 13/702,849

(22) PCT Filed: Jun. 7, 2011

(86) PCT No.: PCT/EP2011/059371
§ 371 (c)(1), (2), (4) Date: Dec. 28, 2012

(87) PCT Pub. No.: WO2011/154394
PCT Pub. Date: Dec. 15, 2011

(65) Prior Publication Data
US 2013/0109113 A1 May 2, 2013

(30) Foreign Application Priority Data
Jun. 7, 2010 (WO) .................. PCT/IB2010/052520

(51) Int. Cl.
*H01L 21/00* (2006.01)
*H01L 21/02* (2006.01)
*B41J 2/16* (2006.01)

(52) U.S. Cl.
CPC ............... *H01L 21/02* (2013.01); *B41J 2/1603* (2013.01); *B41J 2/162* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1635* (2013.01)

(58) Field of Classification Search
None
See application file for complete search history.

(56) References Cited

U.S. PATENT DOCUMENTS 5,850,241 A * 12/1998 Silverbrook .................... 347/54
6,938,340 B2 * 9/2005 Haluzak et al. .............. 29/890.1
2002/0080212 A1 6/2002 Moon et al.

(Continued)

FOREIGN PATENT DOCUMENTS

EP 1061584 A2 12/2000

(Continued)

OTHER PUBLICATIONS

International Search Report of PCT/EP2011/059371 mailed Aug. 23, 2011.
Written Opinion of the International Searching Authority, Jul. 12, 2012.

*Primary Examiner* — Charles Garber
*Assistant Examiner* — Brigitte Paterson
(74) *Attorney, Agent, or Firm* — Greenblum & Bernstein, P.L.C.

(57) ABSTRACT

A method of manufacturing an ink jet printhead includes: providing a silicon substrate including active ejecting elements; providing a hydraulic structure layer; providing a silicon orifice plate having a plurality of nozzles for ejection of said ink; and assembling the silicon substrate with said hydraulic structure layer and said silicon orifice plate. Providing the silicon orifice plate comprises: providing a silicon wafer having a substantially planar extension delimited by a first and a second surfaces; performing a thinning step at the second surface so as to remove a central portion having a preset height; and forming in the silicon wafer a plurality of through holes, each defining a respective nozzle for ejection of the ink.

5 Claims, 8 Drawing Sheets

(56) References Cited

U.S. PATENT DOCUMENTS

| | | | | |
|---|---|---|---|---|
| 2003/0119281 | A1 | 6/2003 | Suzuki et al. | |
| 2006/0118512 | A1* | 6/2006 | Arakawa et al. | 216/27 |
| 2009/0176322 | A1* | 7/2009 | Joyner et al. | 438/21 |

FOREIGN PATENT DOCUMENTS

| | | | |
|---|---|---|---|
| EP | 1065059 | | 1/2001 |
| EP | 1537997 | A1 | 6/2005 |
| JP | 56-130252 | | 10/1981 |

* cited by examiner

Fig.1
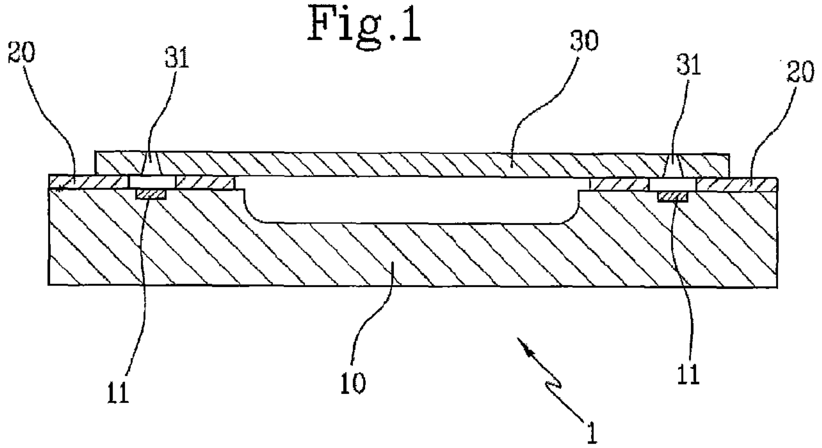
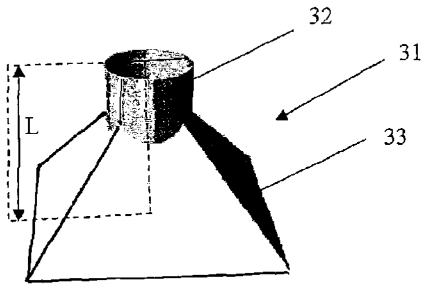
Fig.2

| STEP | SCHEME | DESCRIPTION |
|---|---|---|
| 1 | 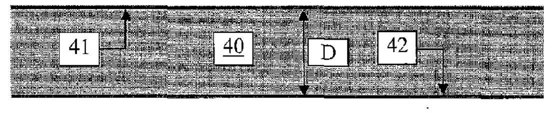 | - 250 um wafer (DSP)<br>- Thermal Oxidation |
| 2 | 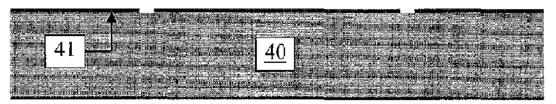 | - Litho Nozzle (31 um)<br>- Oxide Dry Etching |
| 3 | 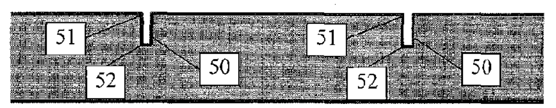 | - Silicon Dry Etching (80 um)<br>- Re – Oxidize (with or without we) |
| 4 | 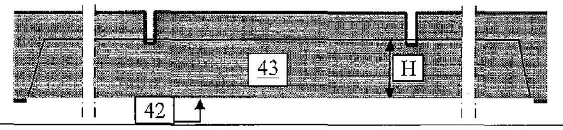 | - Oxide Wet Etching (backside) |
| 5 | 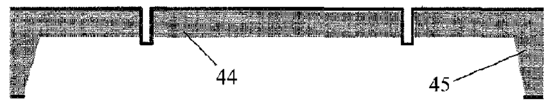 | - Silicon Wet Etching (70 ± TTV) |
| 6 | 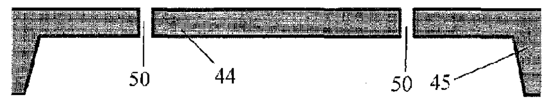 | - Oxide Wet Etch (plug)<br>- Re - Oxidize |
| 7 | 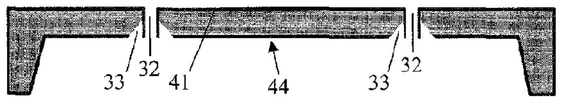 | - Litho Funnel (91 um - backside)<br>- Oxide Dry Etching (in holes??)<br>- Silicon Wet Etching (49 um) |
| 8 | 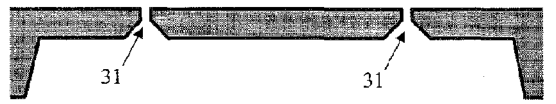 | - Oxide Wet Etching<br>- Re - Oxidize |
Fig.4

| STEP | SCHEME | DESCRIPTION |
|---|---|---|
| 1 | 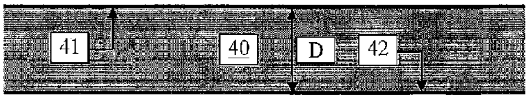  | - 250 um wafer (DSP)<br>- Thermal Oxidation |
| 2 | 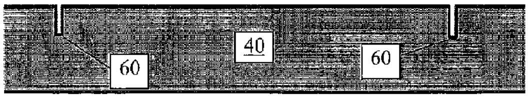  | - Litho Align. Through Holes (80 um)<br>- Oxide Dry Etching<br>- Silicon Dry Etching (60 um)<br>- Re – Oxidize (not necessary) |
| 3 | 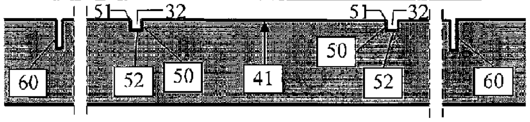  | - Litho Nozzle (31 um)<br>- Oxide Dry Etching<br>- Silicon Dry Etching (21 um)<br>- Re – Oxidize (with or without WE) |
| 4 | 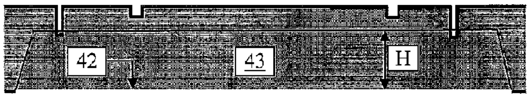  | - In holder Oxide Wet Etching (backside) |
| 5 | 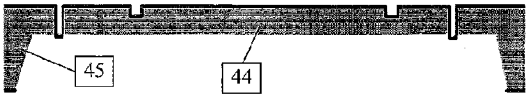  | - Silicon Wet Etching (70 ± TTV) |
| 6 | 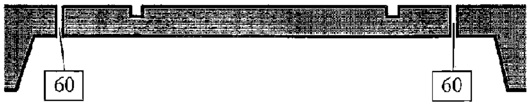  | - Oxide Wet Etch (plug)<br>- Re - Oxidize |
| 7 | 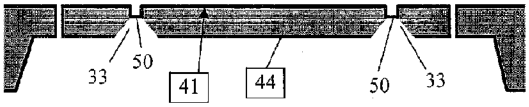  | - Litho Funnel (91 um - backside)<br>- Oxide Dry Etching<br>- Silicon Wet Etching (49 um) |
| 8 |   | - Oxide Wet Etching<br>- Re - Oxidize |

Fig.5

| STEP | SCHEME | DESCRIPTION |
|---|---|---|
| 1 | 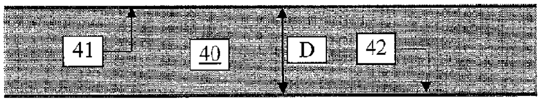  | - 250 um wafer (DSP)<br>- Thermal Oxidation |
| 2 | 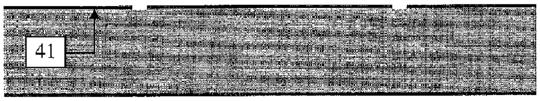  | - Litho Nozzle (31 um)<br>- Oxide Dry Etching |
| 3 | 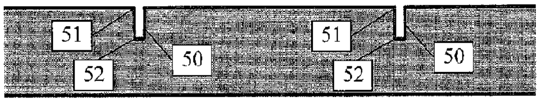  | - Silicon Dry Etching (80 um)<br>- Re – Oxidize (with or without we) |
| 4 | 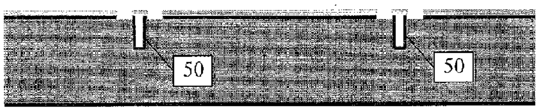  | - Litho Funnel (91 um; dry resist opt.)<br>- Oxide Dry Etching |
| 5 | 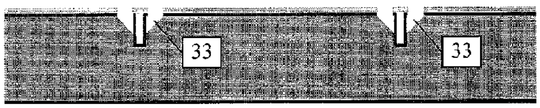  | - (opt. Strip Resist)<br>- Silicon Wet Etching (49 um) |
| 6 | 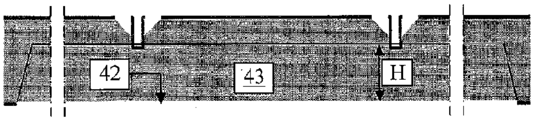  | - Oxide Wet Etching (backside) |
| 7 | 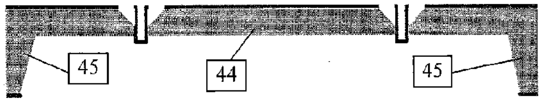  | - Silicon Wet Etching (70 ± TTV) |
| 8 | 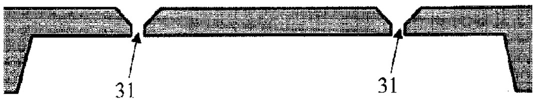  | - Oxide Wet Etch<br>- Re - Oxidize |
Fig.6

| STEP | SCHEME | DESCRIPTION |
|---|---|---|
| 1 | 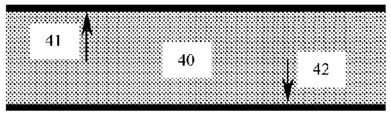  | - 250 μm wafer (DSP)<br>- Thermal oxidation (1,400 nm) |
| 2 | 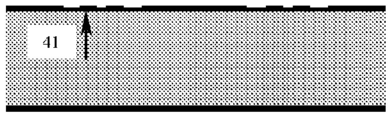  | - Litho Nozzle and Funnel<br>- Oxide Dry Etching |
| 3 | 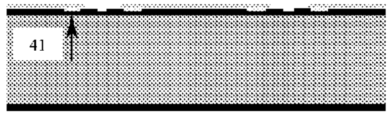  | - Positive photoresist coating<br>- Exposure and development |
| 4 | 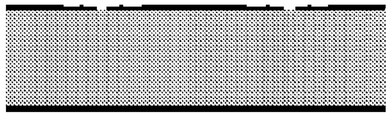 | - Oxide Dry-Etching |
| 5 | 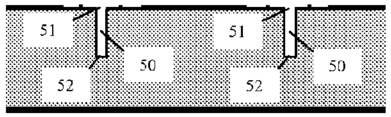  | - Silicon Dry Etching (80nm)<br>- Thermal Oxidation (140 nm) |
| 6 | 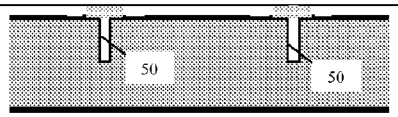  | - Negative photoresist coating<br>- Exposure and development |
| 7 | 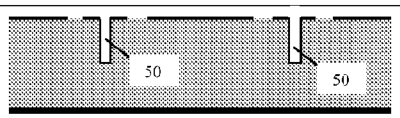  | - Oxide Dry-Etching<br>- Photoresist removal |
| 8 | 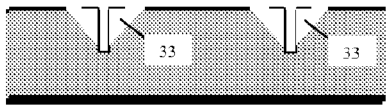  | - Silicon Wet Etching |
| 9 | 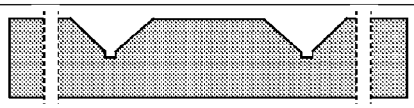 | - Oxide Dry-Etching<br>- Thermal Oxidation (140 nm) |
| 10 | 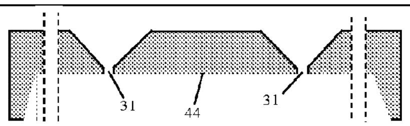  | - Oxide Wet Etching<br>- Silicon Wet Etching |

Fig. 7

| STEP | SCHEME | DESCRIPTION |
|---|---|---|
| 1 | 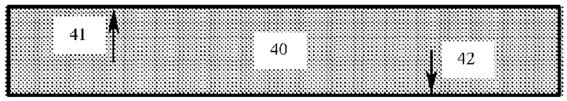  | - 250 um wafer (DSP)<br>- Thermal Oxidation |
| 2 | 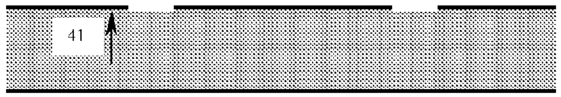  | - Litho Nozzle (31 um)<br>- Oxide Etching |
| 3 | 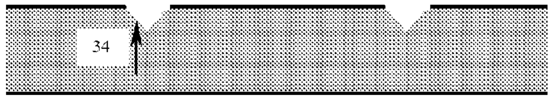  | - (opt. Strip Resist)<br>- Silicon Wet Etching |
| 4 | 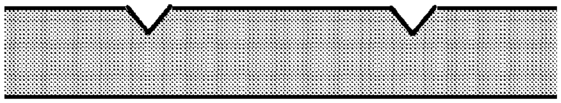 | - Oxide Wet Etching<br>- Re-oxidize |
| 5 | 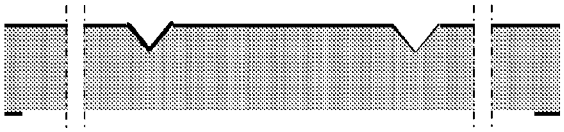 | - Oxide etching |
| 6 | 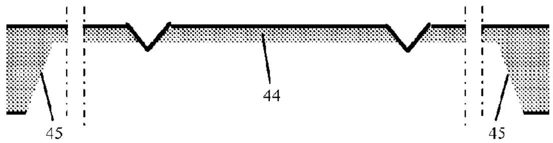  | Silicon Wet Etching |
| 7 | 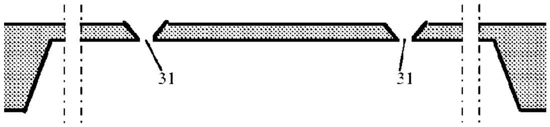  | - Oxide Wet Etch<br>- Re - Oxidize |
Fig. 8

METHOD OF MANUFACTURING AN INK-JET PRINTHEAD

CROSS-REFERENCE TO RELATED APPLICATIONS

This application is a U.S. National Stage of International Application No. PCT/EP2011/059371, filed Jun. 7, 2011, claiming priority to PCT/IB2010/052520, filed Jun. 7, 2010.

BACKGROUND

The present invention relates to a method of manufacturing an ink-jet printhead.

The method according to the invention can be applied for production of both thermal ink-jet printheads and piezoelectric ink-jet printheads.

Known ink-jet printheads comprise a silicon substrate, which includes the active ejecting elements, i.e. the thermal ejectors or the piezoelectric ejectors.

Known printheads also include a hydraulic structure layer, that define hydraulic circuits through which ink flows, and an orifice plate having a plurality of nozzles for ejection of said ink onto the medium to be printed.

The orifice plate can be made, for example, by electroplating of a layer of nickel, that may be covered by a gold or palladium additional layer.

It is to be noted that the known processes for manufacturing printheads include a step of thermo-compression, through which the different layers are fixed together.

In this respect, orifice plates made of nickel present severe drawbacks since nickel and silicon have significantly different behaviours when heated at 150° C.-200° C. (i.e. at temperatures typical of thermo-compression processes).

Therefore, a precise mutual positioning of the silicon chips and respective nozzles can not be obtained. In particular, this problem becomes very critical with the increasing length of the chip and nozzle plate.

Furthermore, residual forces due to the rigid connection between elements having different thermal behaviours can even cause breaking of the silicon chips and/or detachment of the different parts of the printhead.

This effect is particularly critical in industrial applications, wherein the volume of the ink droplets is larger than in standard applications. This implies that the orifice plate can be very thick and produce higher stress due to thermal expansion.

Another drawback of the nickel orifice plates consists in that such orifice plates can not be used in certain industrial applications, wherein industrial abrasive inks cause progressive damaging of the nickel and/or possible gold/palladium protective layer.

It is to be noted that also chemical corrosion problems may arise when certain industrial inks are used.

An additional drawback related to nickel orifice plates consists in the inherent low precision of the electro-formation process, that necessarily causes misalignments between the nozzles and the corresponding chips and hydraulic structures.

SUMMARY

The Applicant has thus verified that the above mentioned problems can be solved by making the nozzle plate of silicon, i.e. of the same material as the substrate which includes the active ejecting elements.

However the Applicant has also noted that using silicon for making the orifice plate presents some additional problems.

In fact the thinner silicon wafers that are usually commercially available are about 200 μm thick, for diameters equal or larger than 6 inches (15.24 cm).

These wafers are too thick to be used to obtain, through traditional technologies, orifice plates.

The thickness that would be ideally desirable is comprised between 10 and 100 μm (for example about 50 μm). However, such thinner silicon wafers are very difficult to be realized and, therefore, are extremely expensive.

Furthermore, such thin silicon wafers are very difficult to be handled, both by hands and by automatic systems in view of their fragility.

EP1065059 discloses a method for producing silicon orifice plates comprising a step of forming a plate dividing pattern, corresponding to an external shape of each silicon plate on a first surface of the silicon wafer; the plate dividing pattern is not formed in the external periphery portion of the wafer.

In order to maintain the strength of the silicon wafer during a subsequent step of reducing from the reversed surface, by a grinding or polishing process, the thickness of the silicon wafer, the method further comprises a step of adhering a tape on the first surface of the silicon wafer.

The Applicant has found that the above problems can be solved by starting from a commercially available silicon wafer (200-250 μm thick, for example), and removing a central portion thereof, so that the remaining structure comprises a base portion having a planar extension, and a peripheral portion extending, from said base portion, transversally with respect to the planar extension of said base portion. The nozzles are formed in the base portion, before and/or after the mentioned central portion is removed; the peripheral portion allows the silicon wafer to be easily handled by automatic robots in automated manufacturing lines.

Eventually, the silicon wafer is cut to obtain a plurality of orifice plates, each of which can be assembled with respective silicon substrate and hydraulic structure layer in order to obtain an ink-jet printhead.

Alternatively, the silicon wafer with the nozzle plates could be directly joined to the printhead wafer by means of a wafer bonding process. This wafer bonding can be a direct bonding or an indirect bonding by means of an adhesive layer.

In particular, the invention relates to a method of manufacturing an ink-jet printhead comprising:

- providing a silicon substrate including active ejecting elements;
- providing a hydraulic structure layer for defining hydraulic circuits through which ink flows;
- providing a silicon orifice plate having a plurality of nozzles for ejection of said ink;
- assembling said silicon substrate with said hydraulic structure layer and said silicon orifice plate
- wherein providing said silicon orifice plate comprises:
- providing a silicon wafer having a substantially planar extension delimited by a first and a second surfaces opposite to each other;
- performing a thinning step at said second surface so as to remove from said second surface a central portion having a preset height, said silicon wafer being formed, following said thinning step, by a base portion having a planar extension and a peripheral portion extending, from said base portion, transversally with respect to the planar extension of said base portion;
- forming in said silicon wafer a plurality of through holes, each defining a respective nozzle for ejection of said ink.

Preferably the silicon wafer undergoes a dicing step, wherein it is cut and a plurality of nozzles plates, including the mentioned nozzle plate, is obtained.

Alternatively, the silicon wafer with the nozzle plates could be directly joined to the printhead wafer by mean of a wafer bonding process. This wafer bonding can be a direct bonding or an indirect bonding by means of an adhesive layer.

BRIEF DESCRIPTION OF THE DRAWINGS

Further features and advantages will become more apparent from the detailed description of a preferred, but not exclusive, embodiment of a method of manufacturing an ink-jet printhead, in accordance with the present invention. This description will be set out hereinafter with reference to the accompanying drawings, given by way of non-limiting example, in which:

FIG. 1 schematically shows a printhead manufactured through the method according to the invention;

FIG. 2 schematically shows a detail of FIG. 1, particularly concerning the shape of a nozzle;

FIG. 4 schematically shows the steps carried out in a second embodiment of the method according to the invention;

FIG. 5 schematically shows the steps carried out in a third embodiment of the method according to the invention;

FIG. 6 schematically shows the steps carried out in a fourth embodiment of the method according to the invention;

FIG. 7 schematically shows the steps carried out in a fifth embodiment of the method according to the invention;

FIG. 8 schematically shows the steps carried out in a sixth embodiment of the method according to the invention;

DETAILED DESCRIPTION

Figure 3:
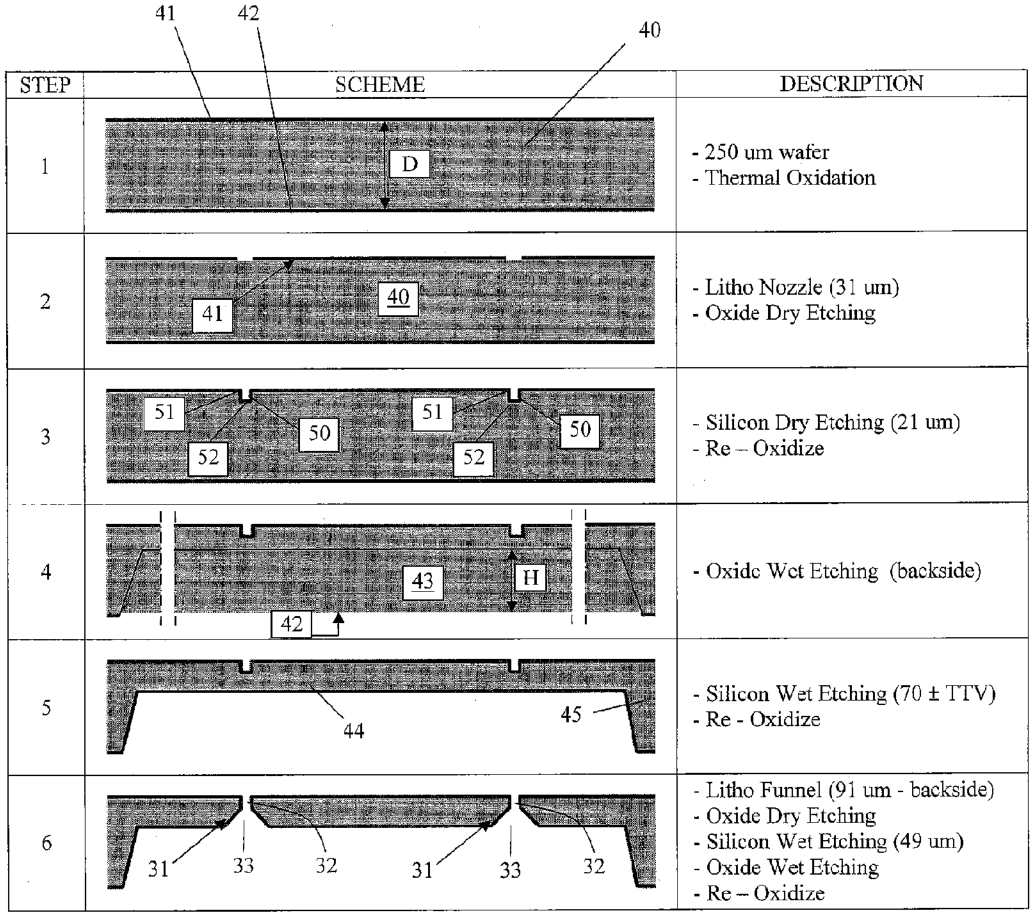
FIG. 3 schematically shows the steps carried out in a first embodiment of the method according to the invention.

With reference to the drawings, a printhead manufactured with the method in accordance with the present invention has been generally denoted at 1.

The method according to the invention comprises a step of providing a silicon substrate 10 including active ejecting elements 11.

Preferably, the active ejecting elements 11 are heating elements, that heat the ink in order to cause generation of ink droplets and ejection of the same. In this case, the printhead 1 is a thermal ink-jet printhead.

In an alternative embodiment, the active ejecting elements 11 are piezoelectric elements, that are electrically actuated in order to displace a membrane and consequently push the ink out of the nozzles, causing ejection of the same. In such embodiment, the printhead 1 is a piezoelectric ink-jet printhead.

The silicon substrate 10 also includes an electric circuit (not shown) that is configured to properly and selectively command the active ejecting elements 11 so that ink is ejected on a determined medium to be printed, according to preset patterns.

The method according to the invention further comprises a step of providing a hydraulic structure layer 20 for defining hydraulic circuits through which the ink flows.

Preferably the hydraulic structure layer 20 is a polymeric film whose thickness can be comprised between 10 μm and 200 μm.

Preferably the hydraulic structure layer 20 defines ejection chambers, wherein the ink undergoes the action of the active ejecting elements 11, and feeding channels, that guide the ink to said chambers. Preferably, the ink is stored in a reservoir and reaches the feeding channels through an ink feed slot (not shown).

The method according to the invention further comprises a step of providing a silicon orifice plate 30 having a plurality of nozzles 31 for ejection of the ink droplets.

Preferably, a plurality of silicon orifice plates are obtained from one silicon wafer.

After the nozzles formation, the orifice plates are separated from each other, preferably through a dicing step. Subsequently, each orifice plate is aligned with and mounted on a respective silicon substrate.

Alternatively, the silicon wafer with the nozzle plates could be directly joined to the printhead wafer by means of a wafer bonding process. This wafer bonding can be a direct bonding or an indirect bonding by means of an adhesive layer.

In the present context, the orifice plate 30 is preferably obtained as briefly indicated hereabove.

As shown in FIG. 1, the silicon substrate 10, the hydraulic structure layer 20 and the orifice plate 30 are assembled, so as to form the printhead 1.

Preferably, the assembly step is performed so that the hydraulic structure layer 20 is located between the silicon substrate 10 and the silicon orifice plate 30.

Preferably, the assembly step comprises a thermo-compression sub-step, wherein the silicon substrate 10, the hydraulic structure layer 20 and the orifice plate 30 are pressed (pressure comprised, for example, between 1 bar and 10 bar) and, at the same time, heated (temperature comprised, for example, between 150° C. and 200° C.).

The duration of the thermo-compression sub-step can vary from a few minutes to some hours.

In more detail, the orifice plate 30 can be obtained as follows.

A silicon wafer 40 is provided, that has a substantially planar extension delimited by a first and a second surfaces 41, 42 opposite to each other.

Preferably the first and second surfaces 41, 42 are substantially parallel to each other.

The first and second surfaces 41, 42 are separated by a distance D.

The silicon wafer 40 can be, for example, 100 μm to 380 μm thick; for example, the silicon wafer can be approximately 200 μm thick.

A thinning step is performed at the second surface 42 of the silicon wafer 40. In this way, a central portion 43 having a preset height H is removed. Preferably the height H of the central portion 43 can be comprised between 20 μm and 360 μm. For example, the height of the central portion 43 can be approximately 120 μm.

Following the thinning step, the silicon wafer 40 is formed by a base portion 44, having a planar extension, and a peripheral portion 45, that extends from the base portion 44 transversally with respect to the planar extension of the same base portion 44.

Figure 9:
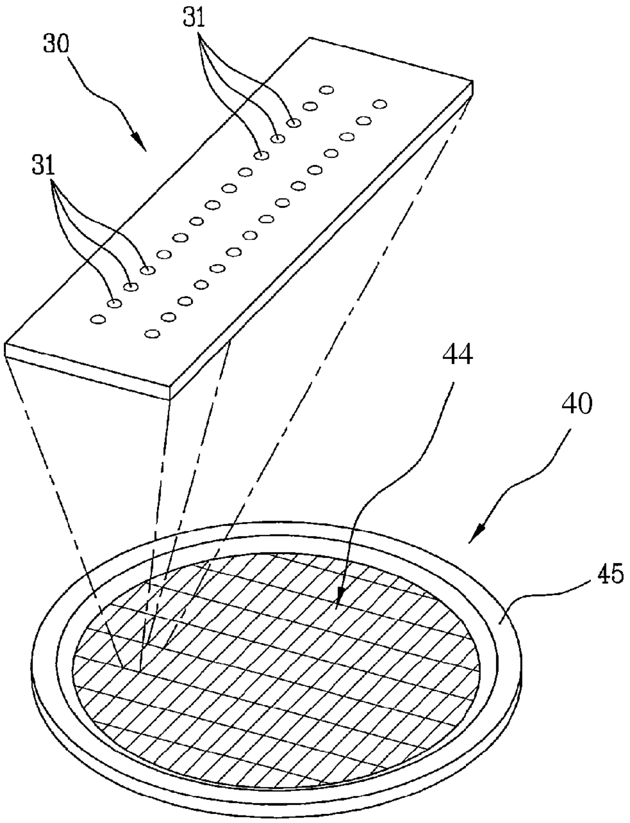
FIG. 9 schematically shows a silicon wafer following a thinning step carried out according to the present invention.

The shape of the silicon wafer 40 at this stage is schematically shown in FIG. 9.

Preferably, the outer surface of the peripheral portion 45 extends from the base portion 44 perpendicularly with respect to the planar extension of the same base portion 44.

In practice, after the thinning step the silicon wafer 40 has a sort of ring structure (FIG. 3, step 5, for example).

In other words, by means of the thinning step, the thickness of the silicon wafer 40 is reduced, apart from the peripheral portion 45, whose thickness remains substantially unchanged with respect to the initial thickness of the same silicon wafer 40.

The silicon wafer 40 thus shaped can be easily handled by hand and/or by automatic systems in automated manufacturing lines, and at the same time can be used to obtain sufficiently thin orifice plates. Accordingly, the peripheral portion 45 can be considered as a "handling portion".

As mentioned above, the orifice plate 30 is preferably obtained through a dicing step wherein the silicon wafer 40, after formation of the nozzles 31, is cut to obtain a plurality of orifice plates.

FIG. 9 schematically shows how the silicon wafer 40 includes a plurality of orifice plates.

Alternatively, the silicon wafer with the nozzle plates could be directly joined to the printhead wafer by means of a wafer bonding process. This wafer bonding can be a direct bonding or an indirect bonding by means of an adhesive layer.

In particular, the nozzle plate 30 is obtained as a portion of said base portion 44.

Preferably, by means of said dicing step, the nozzle plate 30 is separated from other possible nozzle plates formed on the same silicon wafer 40, and from the peripheral or handling portion 45.

Preferably, the difference between the aforementioned distance D (i.e. the distance between the first and second surfaces 41, 42) and the height H of the central portion 43 (i.e. the portion removed by means of the thinning step) defines the longitudinal length L of the nozzles 31 of the orifice plate 30.

In other terms, the longitudinal length L of the nozzles 31 is substantially equal to the thickness of the base portion 44; this means that the height H of the central portion 43 is determined so that, after the thinning step, the remaining portion (base portion 44) of the silicon wafer 40 has a thickness that defines the longitudinal length L of the nozzles 31.

Advantageously, the thinning step can be performed by etching. Preferably, the etching thinning step is a wet-etching step. Alternatively, a reactive ion etching process or a dry-etching process could be applied for the thinning step.

Preferably, the etching thinning step comprises the following sub-steps:

- oxidation of at least the second surface 42; preferably the oxidation process is carried out on the whole silicon wafer 40. Thus, on at least the second surface 42, and preferably on the whole silicon wafer 40, a layer of oxide is formed;
- protection of the external ring on the second surface 42, in particular on a peripheral zone, corresponding to the peripheral portion 45 to be obtained; this protection could be obtained by means of a photolithographic masking process, a protective tape, or by using a wafer holder. It is to be noted that the wafer holder may protect not only the mentioned external ring, but also the wafer back side during the oxide etching. Thus such oxide etching can be not necessarily of the dry type, but it can be, in this circumstance, of the wet type;
- removal of the portion of the oxide that is not covered by the protection;
- removal, preferably by means of a wet-etching action, the central portion 43, i.e. the portion of silicon wafer that is not covered by the protection and the oxide layer;
- removal of the protection and of the oxide layer.

Alternatively, the thinning step can be performed by mechanical grinding. In such a case, a grinding wheel operated by a grinding machine provides the removal of the central portion 43 without the need of any protection and/or oxide layer. A polishing step is usually performed after the grinding step to remove the grinding marks and the subsurface cracks generated during the grinding step.

The method of the invention further comprises a step of forming in the silicon wafer 40 a plurality of through holes, each defining a respective nozzle 31 for ejection of the ink.

Preferably said through holes are formed in the base portion 44.

It is to be noted that, in some embodiments of the invention (first to third embodiment, FIGS. 3-5), each nozzle 31 is formed partly before, partly after the thinning step. In different embodiments (fourth to sixth embodiments, FIGS. 6-8), each nozzle 31 is formed before the thinning step.

The nozzle geometry should be selected in order to reduce the resistance to ink flow as well as to improve the uniformity of the nozzle across the microelectromechanical device.

Trapping of air can be also reduced or eliminated by nozzle geometry.

Preferably each nozzle 31 comprises a top portion 32 and a bottom portion 33, the latter being axially aligned to the top portion 32.

In the present context, "top" and "bottom" refer to the position of the nozzle's portions with respect to the printhead wafer on which the nozzle plate is mounted: the "bottom" portion is closer to and directly facing the hydraulic structure layer 20, whereas the "top" portion is farther from the hydraulic structure layer 20.

The cross section of the top portion 32 can be square, circular or differently shaped.

The bottom portion 33 can have a rectangular or round cross section.

Preferably the top portion 32 of each nozzle 31 has a substantially cylindrical shape.

Preferably the bottom portion 33 of each nozzle 31 has a substantially frusto-pyramidal shape.

The longitudinal length L of the nozzle 31 is defined by the longitudinal length of the top portion 32 plus the height of the bottom portion 33.

Preferably the top portions 32 of the nozzles 31 of the orifice plate 30 are obtained by means of an etching step, that will be referred to as top portion etching step.

Preferably the top portion etching step is a dry-etching step.

In the embodiments of FIGS. 3-7 (first to fifth embodiment), the top portion etching step (preferably a dry-etching step) is carried out, wherein a plurality of substantially cylindrical cavities 50 are formed in the silicon wafer 40 at its first surface 41. At least a part of each of the substantially cylindrical cavities 50 defines the top portion 32 of a respective nozzle 31. Each substantially cylindrical cavity 50 has a first longitudinal end 51 at the first surface 41 of the silicon wafer 40, and a second longitudinal end 52 opposite to the first longitudinal end 51.

Preferably the bottom portions 33 of the nozzles 31 of the orifice plate 30 are obtained by means of an etching step, that will be referred to as bottom portion etching step.

Preferably the bottom portion etching step is an anisotropic wet-etching step.

In the embodiments of FIGS. 3-5, the bottom portion etching step (preferably an anisotropic wet-etching step) is carried out wherein a plurality of bottom portions 33 (preferably having a frusto-pyramidal shape) are formed at the second end 52 of each of said substantially cylindrical cavities 50, thereby obtaining the nozzles 31.

In the embodiments of FIGS. 6-7, the bottom portion etching step (preferably an anisotropic wet-etching step) is carried out, wherein a plurality of bottom portions 33 (preferably having a frusto-pyramidal shape) are formed at the first end 51 of each of the substantially cylindrical cavities 50, thereby obtaining the nozzles 31 of the orifice plate 30.

Alternatively, the nozzle 31 only comprises a single portion 34. In such a case the nozzles 31 preferably have a substantially frusto-pyramidal shape as described above in relation to the bottom portion 33 and the nozzles 31 are obtained by means of a nozzle etching step equal to the above described bottom portion etching step. Preferably the nozzle etching step is an anisotropic wet-etching step.

In the embodiment of FIG. 8, the nozzle etching step (preferably an anisotropic wet-etching step) is carried out, wherein a plurality of single portion 34 (preferably having a frusto-pyramidal shape) are formed in the silicon wafer 40 at its first surface 41, thereby obtaining the nozzles 31 of the orifice plate 30.

It is to be noted that both the top portion etching step, the bottom portion etching step and the nozzle etching step preferably include sub-steps of oxidation, deposition of a photoresist film, removal of the oxide not covered by the photoresist film, removal of the silicon not covered by the oxide, and removal of the remaining photoresist film and oxide.

This kind of processes are known in the art and, therefore, will not be disclosed in further detail.

In the embodiments schematically shown in FIGS. 3-5, the thinning step is carried out after the top portion etching step and before the bottom portion etching step.

In the embodiments of FIGS. 6-7, the thinning step is carried out after the top portion etching step and the bottom portion etching step.

In the embodiments of FIG. 8, the thinning step is carried out after the nozzle etching step.

In more detail, in the first embodiment (FIG. 3) the longitudinal length of the substantially cylindrical cavities 50 is substantially equal to the length of the top portions 32 of the respective nozzles 31. Therefore the longitudinal length of the substantially cylindrical cavities 50 is shorter than the thickness of the base portion 44. The thickness of the base portion 44 in fact is substantially equal to the total longitudinal length L of each nozzle 31.

In the second and fourth embodiments (FIGS. 4 and 6), the longitudinal length of the substantially cylindrical cavities 50 is equal or longer than the thickness of the base portion 44.

In particular, in the second embodiment this feature is advantageous because the top portion etching step is performed at the first surface 41 of the silicon wafer 40, and the bottom portion etching step is performed at the second surface 42 of the silicon wafer 40. Thus the second end 52 of the substantially cylindrical cavity 50, that is visible from the second surface 42 after the thinning step, can be used as a positional reference for a masking step of the bottom portion etching step, so that the bottom portion 33 can be formed according to a proper alignment with the respective top portion 32.

In the fourth embodiment this feature is advantageous because the mask used in the bottom portion etching step is aligned using a feature present on the same first surface 41; therefore the substantially cylindrical cavity 50 has to be sufficiently long (i.e. its length has to be equal or longer than the thickness of the base portion 44) in order to obtain an actual through hole.

In the fifth embodiment this feature is similarly advantageous because such an embodiment has the further advantage of using only one mask for defining the top and bottom portions on the same first surface 41; therefore the substantially cylindrical cavity 50 has to be sufficiently long (i.e. its length has to be equal or longer than the thickness of the base portion 44) in order to obtain an actual through hole.

It is to be noted that the substantially cylindrical cavities 50 are formed in the silicon wafer 40 before the thinning step is carried out. Thus the comparison between the longitudinal length of the substantially cylindrical cavities 50 and the thickness of the base portion 44 can be performed after the thinning step, i.e. after the base portion 44 is actually obtained.

Preferably, as schematically shown in FIG. 5, in the third embodiment of the method according to the invention comprises a forming step, wherein one or more reference cavities 60, having a length longer than the thickness of the base portion 44, is formed at said first surface 41. In particular the forming step is carried out before the thinning step. Likewise, the longitudinal length of the substantially cylindrical cavities 50 can be substantially equal to the length of the top portions 32 of the nozzles 31. The positional reference for the masking step included in the bottom portion etching step is provided by the reference cavities 60, that are visible from the second surface 42 of the silicon wafer 40 after the thinning step is carried out and before the bottom portion etching step is carried out.

Preferably, after the nozzles 31 are formed and the thinning step is carried out, the silicon wafer 40 is cut in separated portions, each defining a respective orifice plate. The orifice plate 30 of the printhead 1 will be one of the orifice plates obtained from the silicon wafer 40.

Alternatively, the silicon wafer with the nozzle plates could be directly joined to the printhead wafer by means of a wafer bonding process. This wafer bonding can be a direct bonding or an indirect bonding by means of an adhesive layer.

The six embodiments of the invention will be hereinafter disclosed in detail with the preferred process choice.

It is to be noted that in each of FIG. 3 (step 4), FIG. 4 (step 4), FIG. 5 (step 3), FIG. 6 (step 6), FIG. 7 (step 9 and 10), and FIG. 8 (step 5, 6 and 7), a couple of interruption symbols is present, to indicate that the distance between the nozzles 31 and the radially external portion 45 of the silicon wafer 40 may be much greater than shown. In practice, a large number of nozzles 31 are formed in the silicon wafer 40; for sake of clarity, only a couple of them are shown in the drawings.

First Embodiment

FIG. 3 schematically shows the basic steps of the first embodiment of the invention with the preferred process choice.

In step 1, a silicon wafer 40 is provided; a silicon oxide layer is formed on the external surface of the silicon wafer 40, preferably through thermal oxidation.

In step 2, through a lithographic process and subsequent etching, preferably a dry-etching, a plurality of portions of the silicon oxide are removed from the first surface 41. Each area from which the oxide is removed will correspond to a respective nozzle.

In step 3, a dry-etching process is performed (this is the "top portion etching step" referred to above), so that the substantially cylindrical cavities 50 are formed.

In this embodiment, the longitudinal length of the cylindrical cavities 50 is substantially equal to the longitudinal length of the top portions 32 (preferably having a substantially cylindrical shape) of the nozzles 31.

Then another oxidation process is carried out, so as to cover also the surface of the substantially cylindrical cavities 50 with a layer of silicon oxide.

In step 4, an oxide wet-etching is performed in order to remove, from the second surface 42, a central portion of oxide; the protection of the external ring could be obtained by means of a photolithographic masking process, a protective tape or by using a wafer holder.

In step 5, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

Then, another oxidation process is carried out, so that all the surfaces of the base portion 44 and peripheral portion 45 are covered with a layer of silicon oxide.

In step 6, through a combination of lithographic process and oxide dry-etching, portions of oxide are removed where the nozzles 31 are supposed to be formed, i.e. at positions corresponding to the already formed substantially cylindrical cavities 50.

Then, a silicon anisotropic wet-etching process (the "bottom portion etching step" mentioned above) removes frusto-pyramidal portions of silicon where the oxide has been removed, so as to form the bottom portions 33 (preferably having a substantially frusto-pyramidal shape) of the nozzles 31.

Then, an oxide wet-etching is performed, in order to remove the layer of oxide that separates each substantially cylindrical cavity 50 with the respective bottom portion 33 (preferably having a substantially frusto-pyramidal shape) and complete the formation of the nozzles 31.

Finally, if required, another oxidation step can be carried out, to cover the whole structure with a layer of oxide.

Second Embodiment

FIG. 4 schematically shows the basic steps of the second embodiment of the invention with the preferred process choice.

In step 1, a silicon wafer 40 is provided; a silicon oxide layer is formed on the external surface of the silicon wafer 40, preferably through thermal oxidation.

In step 2, through a lithographic process and subsequent etching, preferably a dry-etching, a plurality of portions of the silicon oxide are removed from the first surface 41. Each area from which the oxide is removed will correspond to a respective nozzle.

In step 3, a dry-etching process is performed (this is the "top portion etching step" referred to above), so that the substantially cylindrical cavities 50 are formed.

In this embodiment, the longitudinal length of the cylindrical cavities 50 is longer than the longitudinal length of the top portions 32 (preferably having a substantially cylindrical shape) of the nozzles 31. In particular, the longitudinal length of the substantially cylindrical cavities 50 is longer than the overall longitudinal length of the nozzles 31.

Then another oxidation process is carried out, so as to cover also the surface of the substantially cylindrical cavities 50 with a layer of oxide.

In step 4, an oxide wet-etching is performed in order to remove, from the second surface 42, a central portion of oxide.

In step 5, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

In step 6, an oxide wet-etching and another oxidation process are carried out, so that all the surfaces of the base portion 44 and peripheral portion 45 are covered with a layer of oxide.

It is to be noted that the substantially cylindrical cavities 50 are now through holes, that are visible also from the second surface 42. This feature is advantageous because it provides a clear, precise and reliable visual reference for the formation of the frusto-pyramidal portions of the nozzles starting from the backside (i.e. from the second surface 42).

In step 7, a sequence of lithographic process, oxide dry-etching and anisotropic silicon wet-etching (the above mentioned "bottom portion etching step") is performed at the surface of the base portion 44 opposite to the first surface 41.

Likewise, the bottom portions 33 (preferably having a substantially frusto-pyramidal shape) of the nozzles 31 are formed, each corresponding to a respective substantially cylindrical cavity 50.

In step 8, an oxide wet-etching process removes the non-necessary oxide (such as, for example, the oxide left in the nozzles 31). Then, if required, a final oxide process can be performed.

Third Embodiment

FIG. 5 schematically shows the basic steps of the third embodiment of the invention with the preferred process choice.

In step 1, a silicon wafer 40 is provided; an oxide layer is formed on the external surface of the silicon wafer 40, preferably through thermal oxidation.

In step 2, through a sequence of lithographic process, oxide dry-etching and silicon dry-etching (carried out at the first surface 41) a plurality of reference cavities 60 are formed.

Then an oxidation process is performed.

The reference cavities 60 will not be part of respective nozzles, but will be used as a positional reference for the formation of the nozzles 31.

In step 3, through a sequence of lithographic process, oxide dry-etching and silicon dry-etching the substantially cylindrical cavities 50 are formed at the first surface 41, that define respective top portions 32 (preferably having a substantially cylindrical shape) of nozzles 31.

In this embodiment, the longitudinal length of the substantially cylindrical cavities 50 is substantially equal to the longitudinal length of the top portions 32 (preferably having a substantially cylindrical shape) of the respective nozzles 31.

Then, an oxidation process is performed.

In step 4, an oxide wet-etching is performed in order to remove, from the second surface 42, a central portion of oxide.

In step 5, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

In step 6, an oxide wet-etching and subsequent oxidation are carried out.

It is to be noted that, after the oxide wet-etching of step 6, the reference cavities 60 are through holes, that are visible both from the first surface 41 and from the surface opposite to the first surface.

Therefore, the reverence cavities 60 can be used as positional references for the remaining steps to be carried out for the formation of the nozzles 31.

In step 7, a sequence of lithographic process, oxide dry-etching and anisotropic silicon wet-etching (the above mentioned "bottom portion etching step") is performed at the surface of the base portion 44 opposite to the first surface 41.

Likewise, the bottom portions 33 (preferably having a substantially frusto-pyramidal shape) of the nozzles 31 are formed, each corresponding to a respective substantially cylindrical cavity 50.

In step 8, an oxide wet-etching process removes the non-necessary oxide (such as, for example, the oxide left in the nozzles 31). Then, if required, a final oxide process can be performed.

Fourth Embodiment

FIG. 6 schematically shows the basic steps of the fourth embodiment of the invention with the preferred process choice.

In step 1, a silicon wafer 40 is provided; a silicon oxide layer is formed on the external surface of the silicon wafer 40, preferably through thermal oxidation.

In step 2, through a lithographic process and subsequent etching, preferably a dry-etching, a plurality of portions of silicon oxide are removed from the first surface 41. Each area from which the oxide is removed will correspond to a respective nozzle.

In step 3, a dry-etching process is performed (this is the "top portion etching step" referred to above), so that the substantially cylindrical cavities 50 are formed.

In this embodiment, the longitudinal length of the substantially cylindrical cavities 50 is longer than the overall longitudinal length of the respective nozzles 31.

In step 4, through a sequence of lithographic process and oxide dry-etching, portions of oxide are removed around the substantially cylindrical cavities 50. The cylindrical cavities 50 are protected during this silicon oxide dry etching process by a resist mask applied during the lithographic process.

In step 5, an anisotropic silicon wet-etching process (the above mentioned "bottom portion etching step") forms the bottom portions 33 (preferably having a substantially frusto-pyramidal shape) where, in step 4, the oxide has been removed.

In step 6, an oxide wet-etching is performed in order to remove, from the second surface 42, a central portion of oxide.

In step 7, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

In step 8, an oxide wet-etching and optional subsequent oxidation are carried out.

Fifth Embodiment

FIG. 7 schematically shows the basic steps of the fifth embodiment of the invention with the preferred process choice.

In step 1, a silicon wafer 40 is provided; a silicon oxide layer, preferably having a thickness of 1,400 nm, is formed on the external surface of the silicon wafer 40, preferably through thermal oxidation.

In step 2, through a first lithographic process and subsequent etching, preferably a dry-etching, a plurality of portions of silicon oxide are removed from the first surface 41. A single mask is employed to define the edges of the bottom portion and the top portion. Each area from which the oxide is removed will correspond to a respective nozzle. About half of the thickness of the silicon oxide layer (about 700 nm) is removed in step 2. Preferably the oxide etching in step 2 is performed by means of dry-etching.

In step 3, through a second lithographic process, the silicon oxide layer is covered with a positive photoresist, which is then exposed and developed, leaving uncovered the portion corresponding to the top portion.

In step 4, the etching of the silicon oxide portion exposed after step 3 is performed, completely removing the silicon oxide in the area corresponding to the nozzle and reducing the thickness (about 700 nm) in the area around it. Preferably the oxide etching in step 4 is performed by means of dry-etching.

In step 5, a silicon dry-etching process is performed (this is the "top portion etching step" referred to above), so that the substantially cylindrical cavities 50 are formed.

In this embodiment, the longitudinal length of the substantially cylindrical cavities 50 is longer than the overall longitudinal length of the respective nozzles 31.

After that, a silicon oxide layer, preferably having a thickness of 140 nm, is formed on the walls of the substantially cylindrical cavities 50, preferably through thermal oxidation.

In step 6, through a third lithographic process, the silicon oxide layer is covered with a negative photoresist, which is then exposed and developed, in order to cover the portion corresponding to the substantially cylindrical cavities 50 and leaving uncovered the remaining portion of the silicon oxide layer. The coating can be done by deposition of a negative photoresist dry-film or by spray coating of a liquid negative photoresist.

In step 7, the etching of the silicon oxide portion exposed after step 6 is performed, completely removing the silicon oxide in the area corresponding to the edges of the bottom portion and reducing the thickness (about 700 nm) in the area around it. Preferably the oxide etching in step 7 is performed by means of dry-etching. After that, the photoresist is removed.

In step 8, an anisotropic silicon wet-etching process (the above mentioned "bottom portion etching step") forms the bottom portions 33 (preferably having a substantially frusto-pyramidal shape) where, in step 7, the oxide has been removed.

In step 9, the etching of the silicon oxide is performed, completely removing the silicon oxide layers (back and front). Preferably the oxide etching in step 9 is performed by means of wet-etching.

After that, a new silicon oxide layer, preferably having a thickness of 140 nm, is formed on the whole surface, preferably through thermal oxidation.

In step 10, an oxide etching is performed in order to remove, from the second surface 42, a central portion of oxide; the protection of the external ring could be obtained by means of a photolithographic masking process, a protective tape or by using a wafer holder. Preferably the oxide etching in step 10 is performed by means of wet-etching.

After that, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

Sixth Embodiment

FIG. 8 schematically shows the basic steps of the sixth embodiment of the invention with the preferred process choice.

In step 1, a silicon wafer 40 is provided; a silicon oxide layer is formed on the external surface of the silicon wafer 40, preferably through thermal oxidation.

In step 2, through a lithographic process and subsequent etching, preferably a dry etching, a plurality of portions of silicon oxide are removed from the first surface 41. Each area from which the oxide is removed will correspond to a respective nozzle.

In step 3, an anisotropic silicon wet-etching process forms the single portions 34 (preferably having a substantially frusto-pyramidal or pyramidal shape) where, in step 2, the oxide has been removed. In this step the pyramid base width is chosen so that the final pyramid (or frusto-pyramid) height is bigger than the requested final nozzle-plate thickness.

In step 4, an oxide wet-etching is performed in order to remove, from both the first surface 41 and the second surface 42, the silicon oxide. After that, a new silicon oxide layer, preferably having a thickness of 140 nm, is formed on the whole surface, preferably through thermal oxidation.

In step 5, an oxide etching is performed in order to remove, from the second surface 42, a central portion of oxide; the protection of the external ring could be obtained by means of a photolithographic masking process, a protective tape or by using a wafer holder. Preferably the oxide etching in step 5 is performed by means of wet-etching.

In step 6, the "thinning step" is performed, wherein the central portion 43 of the silicon wafer 40 is removed acting on the second surface 42 through a silicon wet-etching (alternatively by grinding or dry etching). As a consequence, the silicon wafer 40 is now formed by the base portion 44 and the peripheral portion 45.

In step 7, an oxide wet-etching and optional subsequent oxidation are carried out.

The invention claimed is:

1. A method of manufacturing an ink jet printhead comprising:

providing a silicon substrate including active ejecting elements;

providing a hydraulic structure layer for defining hydraulic circuits through which ink flows; providing a silicon orifice plate having a plurality of nozzles for ejection of said ink; and assembling said silicon substrate with said hydraulic structure layer and said silicon orifice plate;

wherein providing said silicon orifice plate comprises:

providing a silicon wafer having a planar extension delimited by a first and a second surfaces opposite to each other;

performing a thinning step at said second surface so as to remove from said second surface a central portion having a preset height, said silicon wafer being formed, following said thinning step, by a base portion having a planar extension and a peripheral portion extending, from said base portion transversally with respect to the planar extension of said base portion; and forming in said silicon wafer a plurality of through holes, each defining a respective nozzle for ejection of said ink, wherein each of said nozzles comprises a top portion and a bottom portion axially aligned to said top portion, wherein the step of forming in said silicon wafer a plurality of through holes comprises:

a top portion etching step wherein a plurality of cylindrical cavities are formed in said silicon wafer at said first surface, at least a part of each of said cylindrical cavities defining the top portion of a respective nozzle, each cylindrical cavity having a first longitudinal end at said first surface, and a second longitudinal end opposite to said first longitudinal end, a bottom portion etching step wherein a bottom portion is formed at the second end of at least a part of said cylindrical cavities, thereby obtaining said nozzles, wherein said thinning step is carried out after said top portion etching step and before said bottom portion etching step, and wherein the longitudinal length of said cylindrical cavities is longer than the thickness of said base portion.

2. A method of manufacturing an ink jet printhead comprising:

providing a silicon substrate including active ejecting elements;

providing a hydraulic structure layer for defining hydraulic circuits through which ink flows; providing a silicon orifice plate having a plurality of nozzles for ejection of said ink; and assembling said silicon substrate with said hydraulic structure layer and said silicon orifice plate;

wherein providing said silicon orifice plate comprises:

providing a silicon wafer having a planar extension delimited by a first and second surfaces opposite to each other;

performing a thinning step at said second surface so as to remove from said second surface a central portion having a present height, said silicon wafer being formed, following said thinning step, by a base portion having a planar extension and a peripheral portion extending, from said base portion transversally with respect to the planar extension of said base portion; and forming in said silicon wafer a plurality of through holes, each defining a respective nozzle for ejection of said ink, wherein each of said nozzles comprises a top portion and a bottom portion axially aligned to said top portion, wherein the step of forming in said silicon wafer a plurality of through holes comprises:

a top portion etching step wherein a plurality of cylindrical cavities are formed in said silicon wafer at said first surface, at least a part of each of said cylindrical cavities defining the top portion of a respective nozzle, each cylindrical cavity having a first longitudinal end at said first surface, and a second longitudinal end opposite to said first longitudinal end, a bottom portion etching step wherein a bottom portion is formed at the second end of at least a part of said cylindrical cavities, thereby obtaining said nozzles, and further a forming step wherein one or more reference cavities, having a length longer than the thickness of said base portion, is formed at said first surface, said forming step being carried out before said thinning step.

3. A method of manufacturing an ink jet printhead comprising:

providing a silicon substrate including active ejecting elements;

providing a hydraulic structure layer for defining hydraulic circuits through which ink flows;

providing a silicon orifice plate having a nozzles for ejection of said ink; and assembling said silicon substrate with said hydraulic structure layer and said silicon orifice plate;

wherein providing said silicon orifice plate comprises:

providing silicon wafer having a planar extension delimited by a first and second surfaces opposite to each other;

performing a thinning step at said second surface so as to remove from said second surface a central portion having a preset height, said silicon wafer being formed, following said thinning step, by a base portion having a planar extension and a peripheral portion extending, from said base portion transversally with respect to the planar extension of said base portion; and forming in said silicon wafer plurality of through holes, each defining a respective nozzle for ejection of said ink, wherein each of said nozzles comprises a top portion and bottom portion axially aligned to said top portion, wherein the step of forming in said silicon wafer a plurality of through holes comprises:

a top portion etching step wherein a plurality of cylindrical cavities are formed in said silicon wafer at said first surface,at least a part of said cylindrical cavities defining the top portion of a respective nozzle, each cylindrical cavity having a first longitudinal end at said first surface, and a second longitudinal end opposite to said first longitudinal end, a bottom portion etching step wherein a bottom portion is formed at the second end of at least a part of said cylindrical cavities, thereby obtaining said nozzles, wherein the masking step of said top portion etching step is performed with a first mask on said first surface and the masking step of said bottom portion etching step is performed with a second mask on said second surface, and, wherein the alignment of said bottom portion etching step with said top portion etching step is performed by forming reference cavities in said base portion and using said reference cavities as an alignment reference.

4. A method of manufacturing an ink jet printhead comprising:

providing a silicon substrate including active ejecting elements;

providing a hydraulic structure layer for defining hydraulic circuits through which ink flows;

providing a silicon orifice plate having a plurality of nozzles for ejection of said ink; and assembling said silicon substrate with said hydraulic structure layer and said silicon orifice plate;

wherein providing said silicon orifice plate comprises:

providing a silicon wafer having a planar extension delimited by a first and a second surfaces opposite to each other;

performing a thinning step at said second surface so as to remove from said second surface a central portion having a preset height, said silicon wafer being formed, following said thinning step, by a base portion having a planar extension and a peripheral portion extending, from said base portion transversally with respect to the planar extension of said base portion; and forming in said silicon wafer a plurality of through holes, each defining a respective nozzle for ejection of said ink, wherein each of said nozzles comprises a top portion and a bottom portion axially aligned to said top portion, wherein the step of forming in said silicon wafer a plurality of through holes comprises:

a top portion etching step wherein a plurality of cylindrical cavities are formed in said silicon wafer at said first surface, at least a part of each of said cylindrical cavities defining the top portion of a respective nozzle, each cylindrical cavity having a first longitudinal end at said first surface, and a second longitudinal end opposite to said first longitudinal end;

a bottom portion etching step wherein a bottom portion formed at the first end of at least a part of said cylindrical cavities, thereby obtaining said nozzles, wherein the masking step of said top portion etching step is performed with a first mask and the masking step of said bottom portion etching step is performed with a second mask, both said masking steps being performed on said first surface.

5. Method according to claim 4, wherein the alignment of said bottom portion etching step with said top portion etching step is performed by using as reference said second end of said cylindrical cavity.

* * * * *

UNITED STATES PATENT AND TRADEMARK OFFICE

CERTIFICATE OF CORRECTION

PATENT NO. : 9,012,247 B2
APPLICATION NO. : 13/702849
DATED : April 21, 2015
INVENTOR(S) : Silvia Baldi et al.

It is certified that error appears in the above-identified patent and that said Letters Patent is hereby corrected as shown below:

On the Title Page, at Item (73) Assignee, of the printed patent, "SICPA Holding SA" should read --SICPA HOLDING SA--.

In the Claims

At Column 14, line 66 (Claim 3, line 29) of the printed patent, "surface,at" should read --surface, at--.

Signed and Sealed this
Sixteenth Day of February, 2016

Michelle K. Lee
*Director of the United States Patent and Trademark Office*